US012688896B2

(12) United States Patent
Zhang et al.

(10) Patent No.: US 12,688,896 B2
(45) Date of Patent: Jul. 21, 2026

(54) DECK RESET READ

(71) Applicant: Intel NDTM US LLC, Santa Clara, CA (US)

(72) Inventors: Chao Zhang, Milpitas, CA (US); Xin Sun, Fremont, CA (US); Richard Fastow, Cupertino, CA (US); Giuseppina Puzzilli, Boise, ID (US); Krishna K. Parat, Palo Alto, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 161 days.

(21) Appl. No.: 18/395,538

(22) Filed: Dec. 23, 2023

(65) Prior Publication Data

US 2024/0127896 A1 Apr. 18, 2024

(51) Int. Cl.
G11C 16/04 (2006.01)
G11C 16/34 (2006.01)
(52) U.S. Cl.
CPC ...... G11C 16/3427 (2013.01); G11C 16/0483 (2013.01)

(58) Field of Classification Search
CPC . G11C 16/3427; G11C 16/0483; G11C 16/14; G11C 16/16; G11C 16/26; G11C 16/32; G11C 16/08
USPC ...................................... 365/185.02
See application file for complete search history.

(56) References Cited

U.S. PATENT DOCUMENTS 10,325,665 B2 * 6/2019 Fastow ............... G11C 11/4074
2017/0076805 A1 * 3/2017 Goda ..................... G11C 16/10

* cited by examiner

*Primary Examiner* — Tha-O H Bui
(74) *Attorney, Agent, or Firm* — Morgan, Lewis & Bockius LLP

(57) ABSTRACT

A storage device includes a storage array having multiple decks of NAND cells in a three dimensional (3D) stack. There can be any number of decks that have multiple wordlines in vertical stacks. The decks include a first deck and a second deck. Bias circuitry can apply different voltages to different decks of the storage array. The bias circuitry can apply a low bias to the first deck, with a first voltage low enough to not turn on the NAND cells of the first deck, and simultaneously apply a high bias to the second deck, with a second voltage high enough to turn on the NAND cells of the second deck.

20 Claims, 14 Drawing Sheets

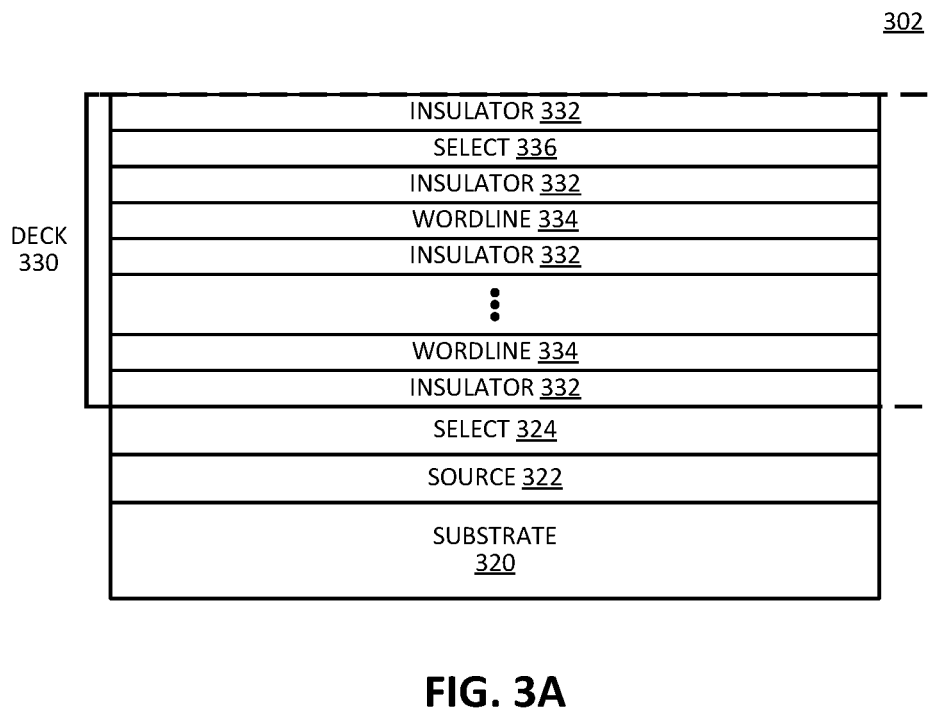

302

| | |
|---|---|
| DECK 330 | INSULATOR 332 |
| | SELECT 336 |
| | INSULATOR 332 |
| | WORDLINE 334 |
| | INSULATOR 332 |
| | ⋮ |
| | WORDLINE 334 |
| | INSULATOR 332 |
| | SELECT 324 |
| | SOURCE 322 |
| | SUBSTRATE 320 |

FIG. 3A

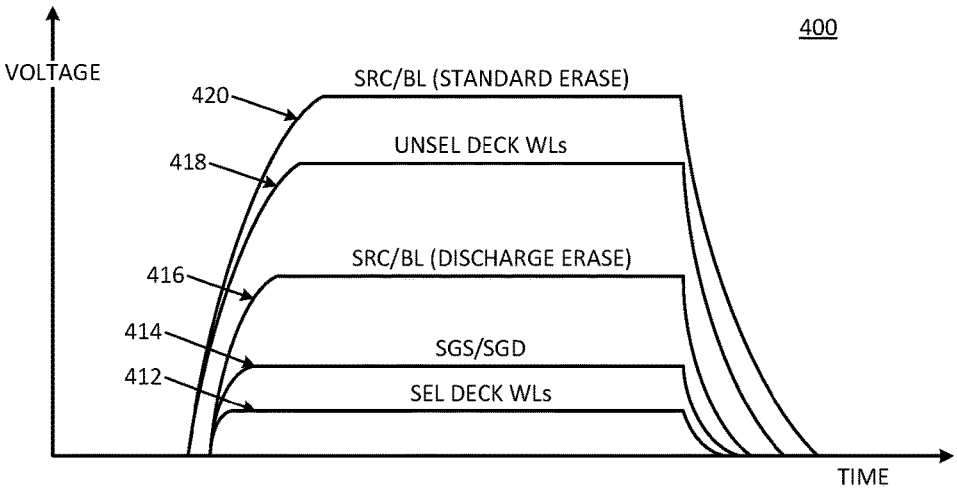

400

VOLTAGE

SRC/BL (STANDARD ERASE)
420

UNSEL DECK WLs
418

SRC/BL (DISCHARGE ERASE)
416

414    SGS/SGD

412    SEL DECK WLs

TIME

| SELECT LOWER DECK | |
|---|---|
| PORTION | VOLTAGE |
| BL | GND |
| SGD | SRC RESET |
| UD | RD RESET |
| MD | RD RESET |
| LD | GND |
| SGS | GND |
| SRC | GND |

| SELECT MIDDLE DECK | |
|---|---|
| PORTION | VOLTAGE |
| BL | GND |
| SGD | SRC RESET |
| UD | RD RESET |
| MD | GND |
| LD | RD RESET |
| SGS | SRC RESET |
| SRC | GND |

| SELECT UPPER DECK | |
|---|---|
| PORTION | VOLTAGE |
| BL | GND |
| SGD | GND |
| UD | GND |
| MD | RD RESET |
| LD | RD RESET |
| SGS | SRC RESET |
| SRC | GND |

DECK RESET READ

TECHNICAL FIELD

Descriptions are generally related to storage devices, and more particular descriptions are related to 3D (three-dimensional) storage devices.

BACKGROUND OF THE INVENTION

Nonvolatile memory such as NAND flash memory is commonly used in storage device. The architecture of a 3D (three-dimensional) NAND device has stacks cells vertically along a vertical pillar (a channel) that connects the cells to the drain plane (SGD (select gate drain)) and source plane (SGS (select gate source)). The cells are connected to the planes through the channel, rather than having a direct discharge path from the body of the cells to the substrate.

The 3D NAND architecture can result in an accumulation of charge in the vertical pillars. In most array operations, the pillars are populated with electrons. Charging the wordlines creates an electric field in the pillar, which can boost the pillar, driving electron carriers into the pillar.

The electrons in the pillars generate an electric field pointing from the local WLs (wordlines) to the pillars, preventing shallowly trapped electrons near the sidewalls of the cells from discharging. Shallowly trapped electrons are referred as being trapped shallowly, because they are weakly trapped, requiring a relatively small amount of energy to discharge. The discharge of trapped electrons can be referred to as "detrapping" the electrons.

It is possible to generate an electric field that will introduce holes into the pillar, facilitating the detrapping of the shallowly trapped electrons. With electrons in the pillar, when the pillar-boosting electric field is released, a significant number of the shallowly trapped electrons can detrap, resulting in a large threshold voltage (Vt) downshift, which negatively impacts RWB (read window budget). The RWB refers to the total separation of voltage edges that define the demarcation levels for a multilevel cell. Thus, loss of RWB can result in data loss.

Having holes in the pillars can be referred to as a stable state. The stable state tends to lead to improved data retention. However, populating the pillars with holes can induce negative impacts, most notably stable state read disturb (SRD), characterized by hot carrier injection.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIGS. 3A-3D provide a representation of forming a multideck array.

FIG. 4 is a plot of an example of voltage levels for a 3D NAND system.

FIGS. 5A-5C are tables of an example of selecting different decks for a deck reset read.

Descriptions of certain details and implementations follow, including non-limiting descriptions of the figures, which may depict some or all examples, and well as other potential implementations.

DETAILED DESCRIPTION OF THE INVENTION

As described herein, a storage device includes a storage array having multiple decks of NAND cells in a three-dimensional (3D) stack. There can be any number of decks that have multiple wordlines in vertical stacks. The bias circuitry can apply a low bias to one of the multiple decks, with a voltage low enough to not turn on the NAND cells of the first deck. The bias circuitry can simultaneously apply a high bias to another of the multiple decks, with a voltage high enough to turn on the NAND cells of the second deck.

In 3D NAND, the NAND cell pillars are connected indirectly to the drain through SGD (select gate drain) and to the source through SGS (select gate source). The boosting of the WLs (wordlines) in various operations can result in the accumulation of carriers in the pillars, typically electron carriers. It is possible to inject holes into the pillars to neutralize residual electrons through the application of a WEP (weak erase pulse), to relax the pillar boosting stress and improve data retention loss. However, WEP does not automatically balance the improved data retention benefit against the risk of SRD (steady-state read disturb).

A deck reset read provides for selective biasing of different decks to different voltage levels to balance the accumulation of electron carriers and hole carriers in the pillars. Thus, a deck reset read enables a system to inject holes into the pillars and balance the desire for data retention with the risk of data loss due to SRD.

For a NAND block having multiple physical decks, a deck reset read pulse is designed to bias the WLs on certain decks at a low voltage, and the WLs on unselected decks at a high voltage. The decks biased to a low voltage can be referred to as selected decks, which are selected for hole carriers in the pillars. The decks biased with a high voltage can be referred to as unselected decks, which are not selected for hole carriers.

In one example, the system first identifies a situation in which all decks are populated with holes. The situation can be induced, such as through a WEP pulse, or can occur through bringing the storage device up to an active state after an idle state or after a suspend state. The system can apply a deck reset read pulse to introduce electrons to the unselected decks while keeping the holes in the selected decks.

The selected decks have a data retention benefit while the unselected decks have reduced risk of hot carrier injection disturb. The selected decks can be flexibly assigned based on NAND characteristics, block wearing, temperature, workload, system policy, or algorithmically, or a combination of multiple of these.

Figure 1:
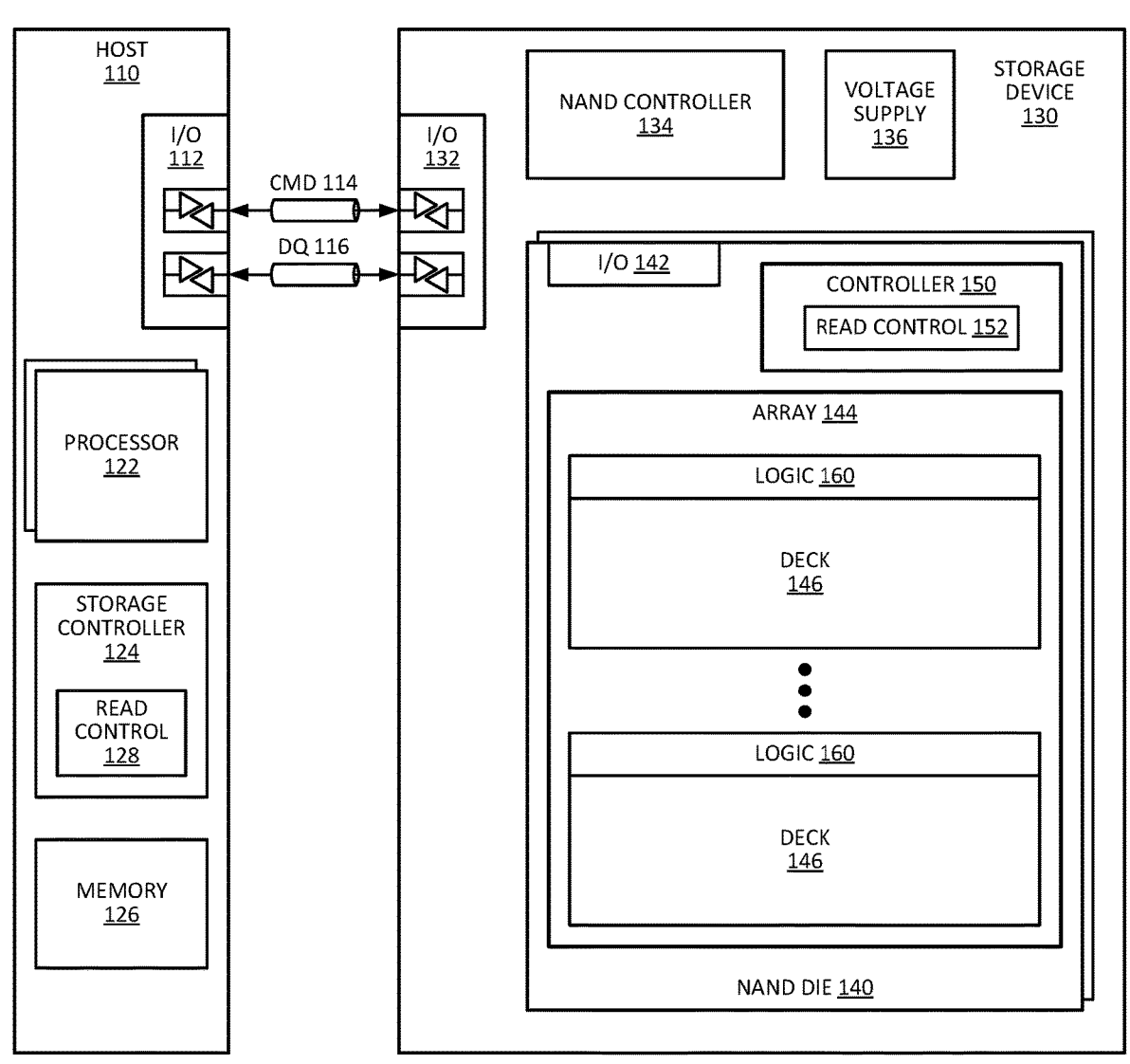
FIG. 1 is a block diagram of an example of a system with a storage device having a multideck array.

FIG. 1 is a block diagram of an example of a system with a storage device having a multideck array. System 100 includes host 110, which represents the host system to which storage device 130 is connected. Storage device 130 provides a storage resource to store data for host 110.

Host 110 includes processor 122, storage controller 124, and memory 126. Processor 122 represents a host processor or computing device for host 110. Processor 122 can be a single core device or a multicore device. Storage controller 124 represents a controller in host 110 that manages access to storage device 130. Storage controller 124 can perform scheduling and manage timing and data transfer with storage device 130.

Memory 126 represents operational memory in host 110. The operational memory is typically volatile memory, which has indeterminate state if power is interrupted to the memory. The operational memory could alternatively be nonvolatile memory, which has determinate state even when power is interrupted to the memory. Memory 126 generally holds data and code for use by processor 122. Data read from storage device 130 is typically stored in memory 126 for use by processor 122.

In one example, storage controller 124 manages the operation of storage device 130 to balance between data retention and risk of SRD. Read control 128 represents logic of storage controller 124 to manage the read operation for storage device 130. In one example, read control 128 can manage the issuing of WEP pulses. In one example, read control 128 can manage the issuing of deck reset read operation.

Host 110 includes I/O (input/output) 112, which represents hardware to interface with an external device, such as storage device 130, which can represent a peripheral device. I/O 132 represents hardware of storage device 130 to interface with host 110 through I/O 112. In one example, the interconnection between I/O 112 and I/O 132 can include a command connection or command link or command bus, as represented by CMD (command) 114. The link/bus can be signal lines over which host 110 sends commands to storage device 130. The interconnection can include a data bus represented by DQ (data) 116.

Storage device 130 includes NAND controller 134, which represents a controller on the storage device to manage the NVM (nonvolatile memory) resources. As illustrated, storage device 130 includes multiple NAND dies 140. In one example, NAND dies 140 include array 144. Array 144 can be a multilevel storage device, such as MLC (multi-level cell), TLC (triple level cell), QLC (quad level cell), or other encoding scheme. Each cell's threshold voltage (Vt) is indicative of the data that is stored in the cell.

NAND dies 140 include I/O 142, which represents interconnection hardware to connect to I/O 132. Controller 150 represents control logic on NAND die 140 to manage access to the different portions of array 144. Array 144 includes multiple decks 146. Decks 146 can be accessed through separate logic 160, which enables NAND die 140 to apply different bias to different decks 146.

Read control 152 represents control for controller 150 to apply different biases based on a deck reset read. Voltage supply 136 provides voltage levels to apply for different WL and BL (bitline) bias values.

The array includes N wordlines (WL[0] to WL[N−1]). Access to the columns, pillars or strings of storage cells can be addressed by row (wordline or WL) address and column (bitline or BL) address, and gated with control gate signals. In one example, the array is organized as multiple subblocks of cells, which is not explicitly shown.

The array includes multiple vertical stacks, with a stack corresponding to each bitline (e.g., BL[0], BL[1], . . . ). The vertical stack includes a vertical channel passing through the various wordlines, with the channel controlled by control gate signals. The control gate signals can be referred to as switching signals that provide gating control for a channel.

A deck reset read can be referred to as a DRR. A deck reset read can alternatively be referred to as MARR (modified adaptive reset read). Deck reset read control can be used to select which decks will have their pillars populated with holes and which decks will have their pillars populated with electrons. Which such control, system 100 can bias decks requiring data retention differently from decks vulnerable to hot carrier injection.

DRR provides flexibility as the selected and unselected decks can be assigned and reassigned depending on the characteristics of the NAND component, the temperature, block wearing, workload, system policy, or a bias algorithm, or a combination of these. The characteristics of the NAND component refer to the inherent electrical characteristics of a NAND architecture, or the resulting characteristics of a process run. The temperature refers to a temperature of the NAND die. The workload refers to the mix of read and write operations applied to the array. Block wearing refers to the number of times a block has been erased. System policy can include various conditions, such as a policy to store different types of data in different decks of the NVM. The bias algorithm can refer to any algorithm designed to manage the access to the NVM, and what portions are biased in what way.

In one example, system 100 applies a combination of WEP to inject holes into decks 146, and then applies a deck reset read to selectively charge the pillars of selected decks with electrons to take a deck out of the steady state. WEP can discharge pillar boosting and improve RWB (read window budget) in HTDR (high temperature data retention). However, WEP induces SRD on the same superblock as the block that is discharged. Deck reset read can balance the WEP HTDR benefit with the SRD risk without complex trim tuning, and with the ability to adapt dynamically to material and temperature. The use of trim tuning is typically sensitive to material and temperature.

In general, array 144 can have any number of decks in the vertical stack. Examples throughout will often reference three decks: a lower deck (LD), a middle deck (MD), and an upper deck (UD). Again, it will be understood that such examples are only for purposes of description, and the principles of applying a deck reset read can apply to any multideck system.

Consider an example of an array that has three decks. In one example, system 100 has a system policy that when a deck in a superblock is on a clean list, the system can issue WEP to induce stable state in the entire superblock, immediately followed by a MARR that puts two valid decks back to a transient state (introducing electrons) and leaves the clean list deck in the stable state (keeping the holes in the pillars). A superblock refers to a group of physical blocks from different arrays that are accessed together for read and write operations. In one example, system 100 can issue WEP and MARR commands separately, while not sending reads to the blocks (or superblocks) subject to a WEP until after a MARR has been sent.

Figure 2A:
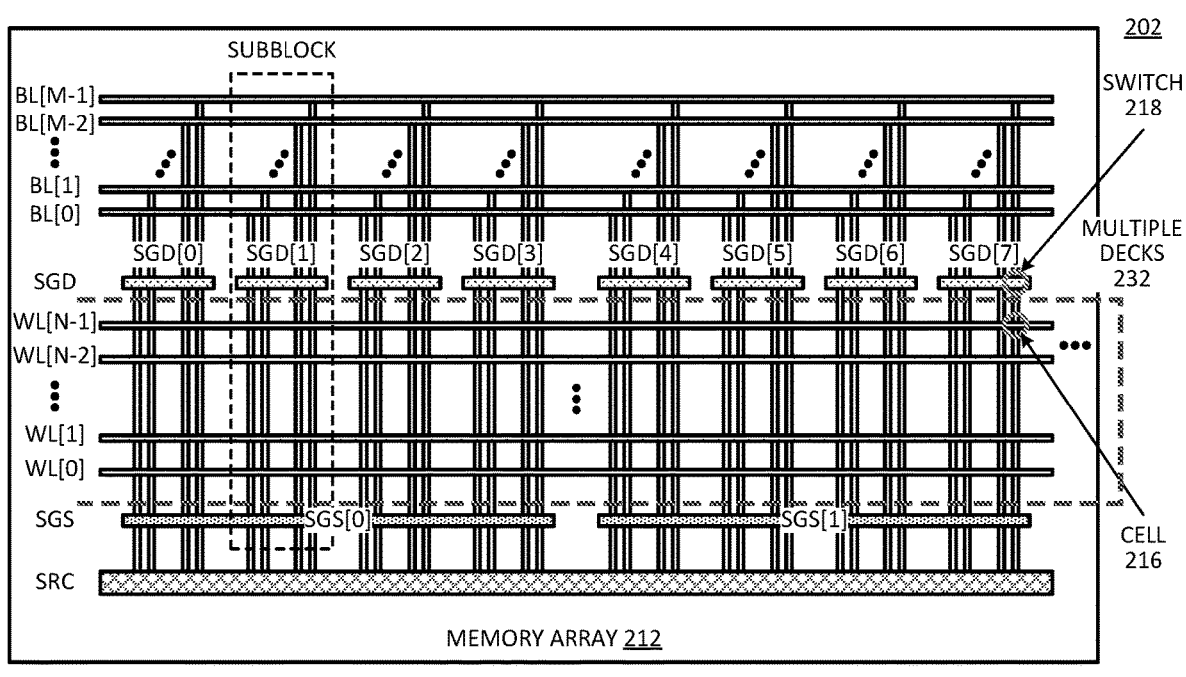
FIG. 2A is a block diagram of an example of a system having a storage array in which a deck can be selectively charged to maintain holes or eliminate holes in the pillar.

FIG. 2A is a block diagram of an example of a system having a storage array in which a deck can be selectively charged to maintain holes or eliminate holes in the pillar. System 202 represents a storage device in which a deck reset read can be implemented. System 202 can be, or be included in, an SSD (solid state drive). System 202 can be integrated into a computing device.

System 202 includes memory array 212, which represents a 3D NAND storage device, with multiple decks of stacked wordlines. In one example, cells 216 represent NAND storage cells. In one example, cells 216 represent NOR-based storage cells. Memory array 212 includes N wordlines (WL[0] to WL[N−1]). N can be a number on the order of hundreds, where each of the multiple decks can include dozens (e.g., 32, 48, 64) wordlines. Multiple decks 232 indicates that the wordlines can be separated into multiple decks.

In one example, memory array 212 is segmented into subblocks. A block of cells refers to cells coupled to the same SGS, with SGS[0] and SGS[1] illustrated. A subblock of cells refers to cells coupled to the same SGD, with SGD[0], SGD[1], SGD[7] illustrated. The separation with source and drain portions are only to be understood as illustrative and not limiting.

In one example, a subblock refers to the columns, pillars, or strings of storage cells 216 that are accessed together. The pillars can be accessed together by responding to a common switching signal. The switching signal can refer to gating control for the pillar. Switch 218 represents the gating control for the pillar. An SGD signal line selectively couples a column pillar to a BL (bitline). An SGS signal line selectively couples a column to a source (SRC), which is a source plane. The source can alternatively be referred to as an SL (source layer), which is a source layer of material integrated onto a semiconductor substrate.

In one example, each subblock includes M bitlines (BL[0] to BL[M−1]). In one example, each storage cell 216 within memory array 212 is addressed or selected by asserting a wordline and a bitline, in conjunction with enabling the column with the gate select switches 218 (shown only on SGD, but SGS switches can be considered included in the control).

System 202 includes circuitry to apply different voltage levels to different layers of the column stack. In one example, system 202 can separately bias the multiple decks in the vertical stack. The separate biasing enables the application of a deck reset read in accordance with any description herein.

Figure 2B:
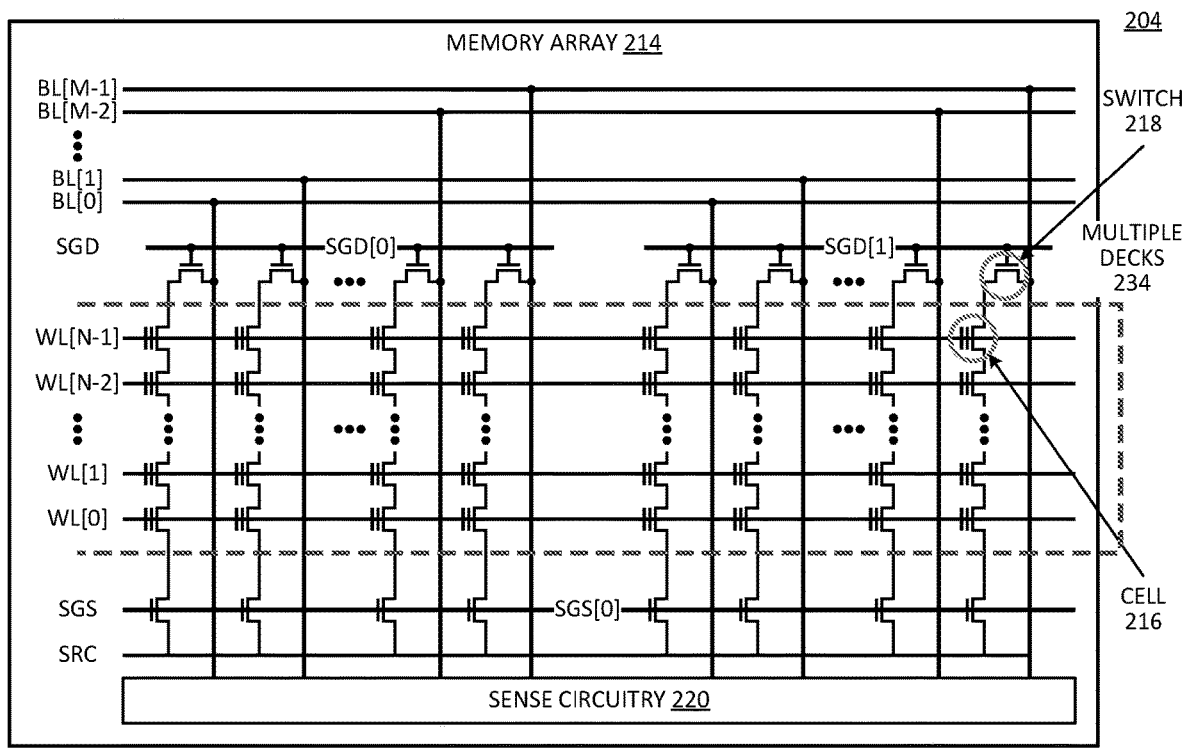
FIG. 2B is a block diagram of an example of a circuit structure for the system of FIG. 2A.

FIG. 2B is a block diagram of an example of a circuit structure for the system of FIG. 2A. System 204 provides an example structure to implement a system in accordance with system 202 of FIG. 2A. Memory array 214 is an example of memory array 212. System 204 illustrates circuit details for SGD[0], SGD[1], and SGS[0]. The source layer is common to all the subblocks, as are the wordlines (WL[0] to WL[N−1]). System 204 illustrates sense circuitry 220, which represents the circuitry to stage data for reads and writes. In one example, cell 216 is formed at an intersection of a wordline and a bitline. In one example, switch 218 is formed at an intersection of a select line a bitline.

As illustrated in system 204 and system 202, the NAND cells are connected in series in the form of pillars. The NAND pillars are connected to the source and drain through SGS and SGD. Pillar boosting refers to the application of a voltage differential between the WL and BL that causes an excess of electrons in the pillar. The absence of a direct discharge path from the body of the NAND cells to a conductive substrate can result in charge accumulation in the pillars.

WEP can release the pillar boosting stress by introducing holes into the NAND pillars to facilitate the detrapping of the shallowly trapped electrons. Deck reset read enables a system to manage which decks will maintain holes, and which will have electrons added to combine with the holes. By managing the biasing of the decks, the system can balance data retention with SRD risk. Memory array 214 has multiple decks 234. In one example, the deck reset read biases the WLs on selected decks with a voltage low enough that cells are turned off on the selected decks, and biases the WLs on unselected decks with a voltage high enough that the cells are turned on the unselected decks.

On a NAND block where the decks are populated with holes (e.g., by operations such as WEP, idling, erase suspend), applying a deck reset read can inject electrons into the unselected decks, while keeping the holes in the selected decks. In this way, the selected decks can have the data retention benefit, while the risk of SRD is minimized for the unselected decks. The selected and unselected decks can be flexibly assigned based on the NAND characteristics, block wearing, temperature, workload, system policy, or other condition.

Consider an ideal condition for the pillar, where there are no trapped electrons. The number of electrons in an unselected deck can be significantly higher than in the ideal condition. The number of electrons in a selected deck can be closer to the number in an unselected deck than to the ideal condition, and still provide significant data retention benefits.

FIGS. 3A-3D provide a representation of forming a multideck array. It will be understood that the features illustrated are not necessarily to scale.

FIG. 3A provides a representation of forming a lowest deck. State 302 illustrates a lower deck formed on a substrate. Substrate 320 represents the base material of the storage die. Source 322 represents a source layer. On source 322, the processing can form select 324, which can be the select gate source for the block. On select 324, the processing can form alternating layers of insulator 332 and wordline 334, where insulator 332 represents an electrical isolation layer between layers of conductor, represented by wordline 334. Deck 330 is the group of insulators 332 and wordlines 334, and can include dozens of wordlines (e.g., 50+ WLs). In one example, deck 330 includes its own select line, represented by select 336. Select 336 can be, for example, a select gate drain to enable specific control to bias deck 330.

Figure 3B:
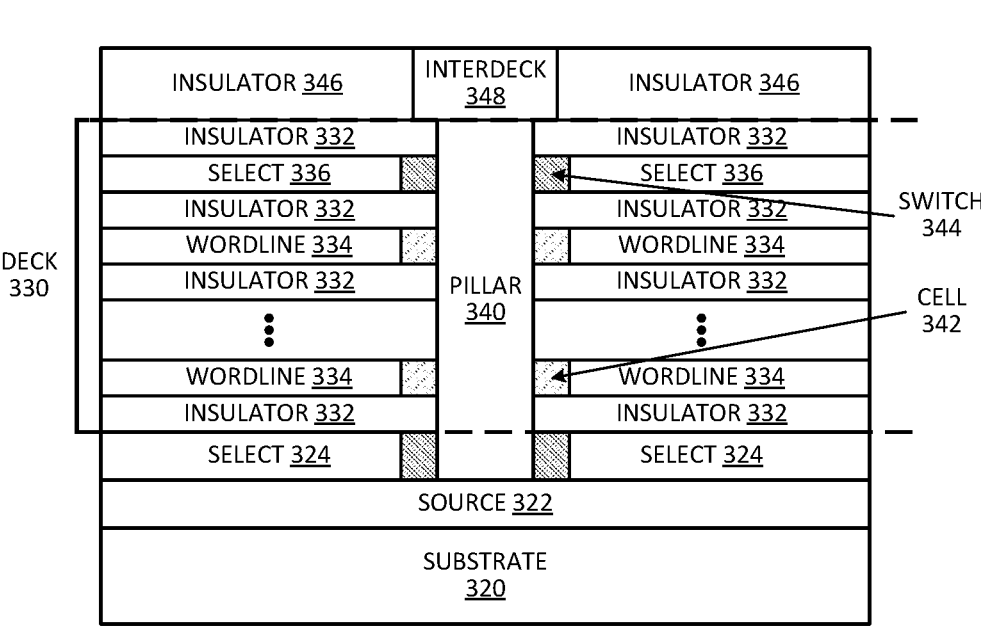

FIG. 3B provides a representation of forming a pillar for the lower deck. State 304 illustrates further processing of state 302, with pillar 340 formed through the layers of deck 330, including the wordlines, insulators, and select gate drain for deck 330. Pillar 340 provides a conductive channel through deck 330 to source 322. Insulator 346 represents an isolation layer between decks. Interdeck 348 represents a conductive stop layer between decks to electrically connect the channel between adjacent decks. State 304 illustrates cells 342 formed where wordlines 334 intersect pillar 340.

Switch 344 illustrates the select control switches at the intersection of the select line with pillar 340.

Figure 3C:
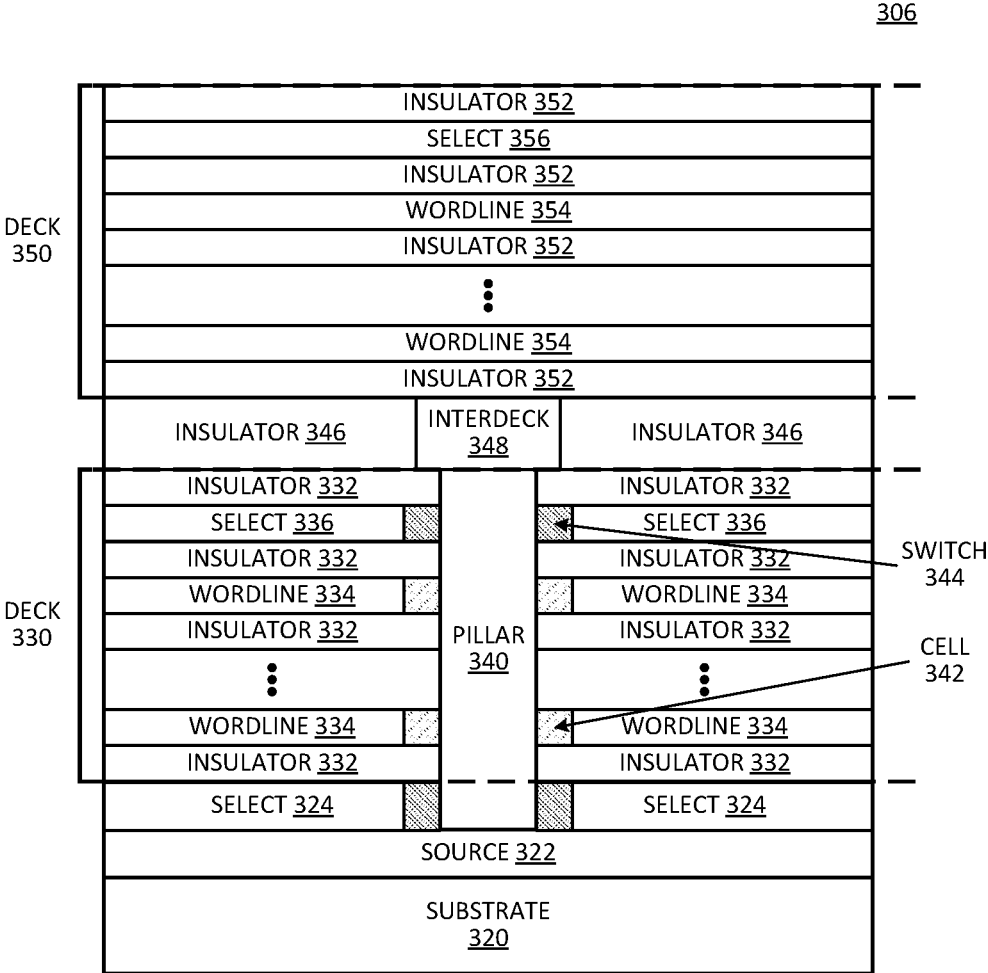

FIG. 3C provides a representation of forming a middle deck. State 306 illustrates further processing of state 304, with a next deck formed on the lower deck. The processing can form alternating layers of insulator 352 and wordline 354, where insulator 352 represents an electrical isolation layer between layers of conductor, with the conductor represented by wordline 354. Deck 350 is the group of vertically stacked layers of insulators 352 and wordlines 354. In one example, deck 350 includes its own select line, represented by select 356.

Figure 3D:
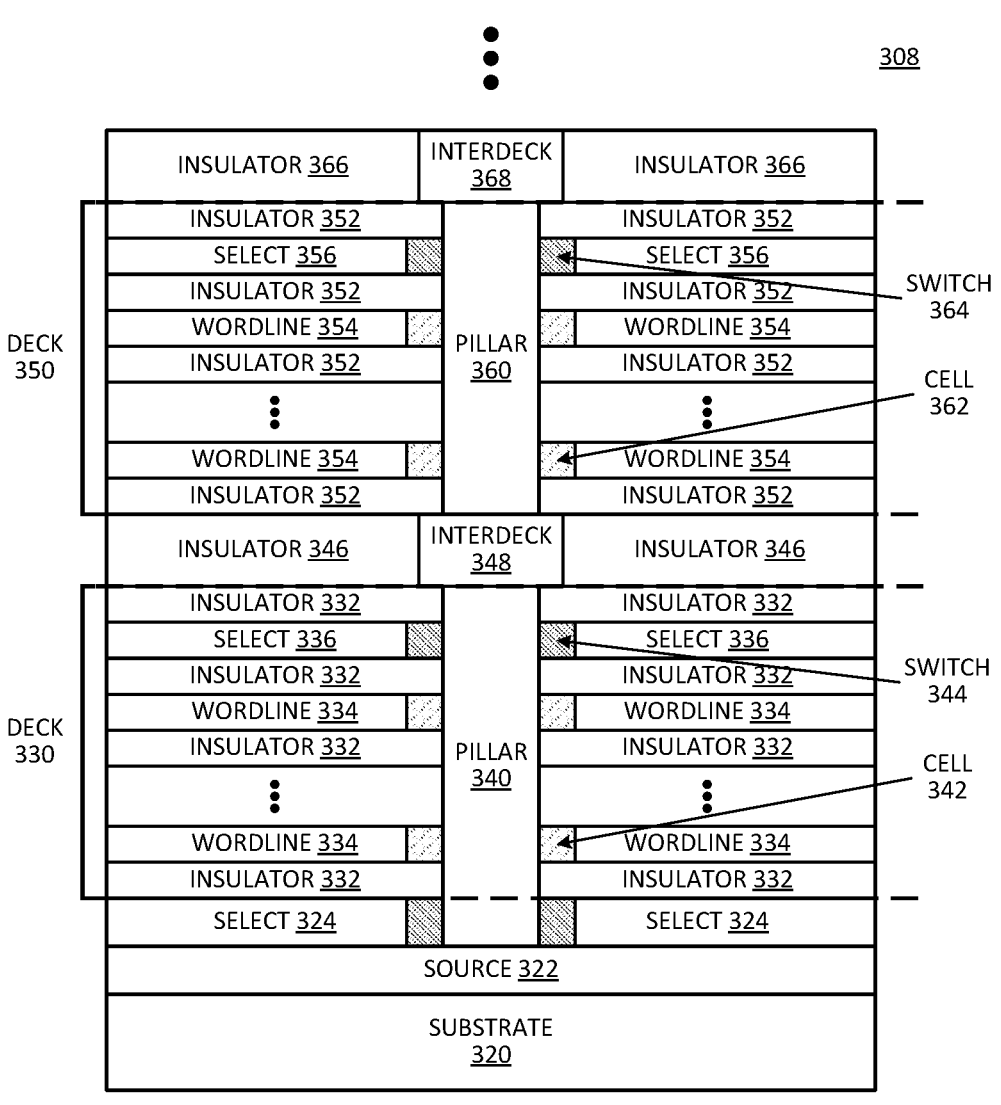

FIG. 3D provides a representation of forming a pillar for the subsequent deck. State 308 illustrates further processing of state 306, with pillar 360 formed through the layers of deck 350, including the wordlines, insulators, and select gate drain for deck 350. Pillar 360 provides a conductive channel through deck 350 to interdeck 348. Insulator 366 represents an isolation layer between deck 350 and a subsequent deck. Interdeck 368 represents a conductive stop layer between decks to electrically connect the channel between adjacent decks. State 308 illustrates cells 362 formed where wordlines 354 intersect pillar 360. Switch 364 illustrates the select control switches at the intersection of the select line with pillar 360.

State 308 illustrates a circuit with two decks formed vertically. It will be understood that state 308 illustrates only two decks, and that more decks can be formed on top of what is illustrated. In theory, any number of decks could be formed. The limitations on the number of decks can include practical and technological considerations (e.g., processing issues, flow of charge) and operational considerations (e.g., power delivery, heat dissipation).

Figure 3E:
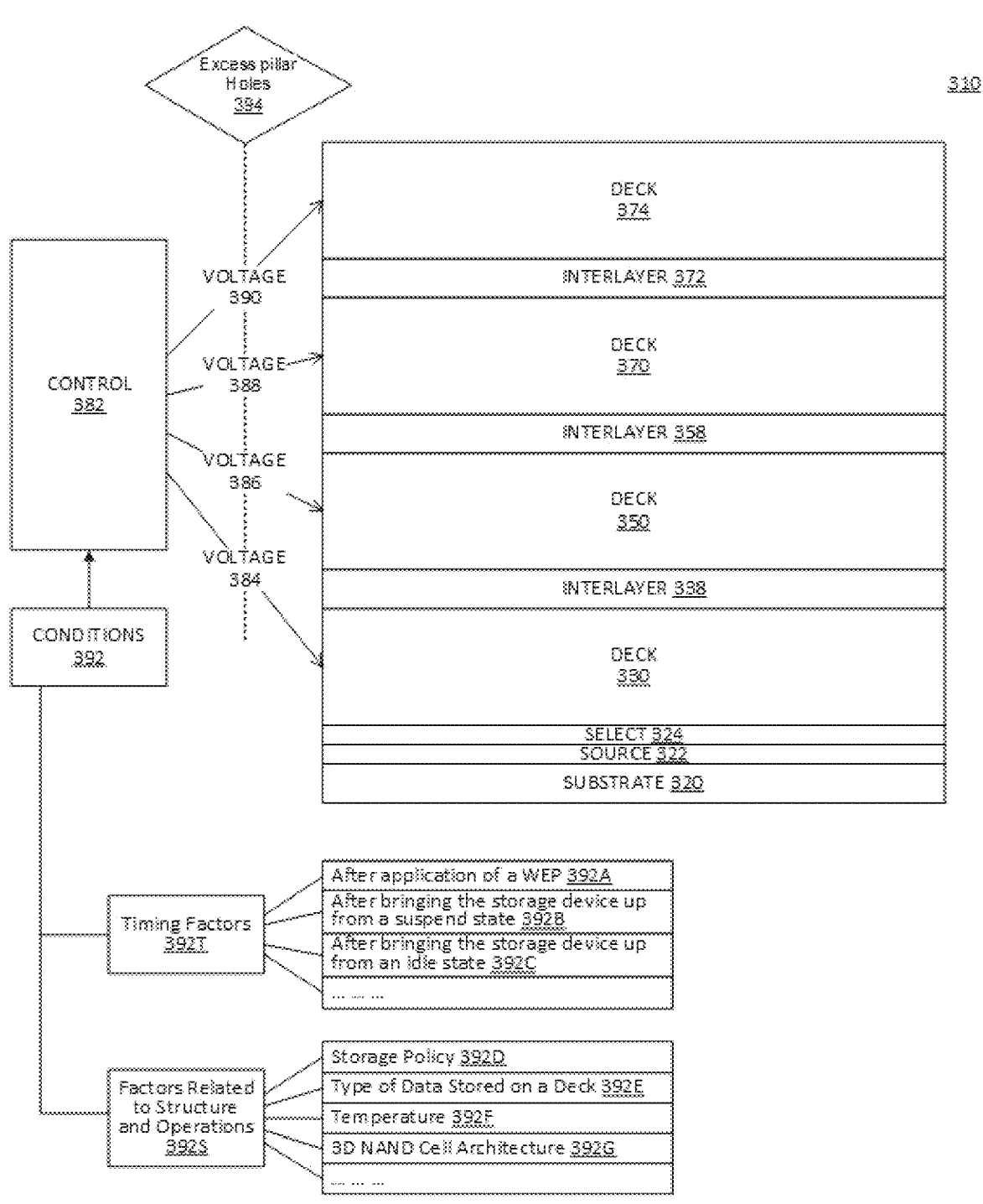
FIG. 3E provides a representation of a multideck array where different decks can be separately biased.

FIG. 3E provides a representation of a multideck array where different decks can be separately biased. It will be understood that the features illustrated are not necessarily to scale. System 310 represents a macro-level view of a semiconductor circuit in accordance with what is illustrated in state 308. System 310 illustrates a storage device with four decks, with the understanding that the system can have fewer or more decks than what is shown.

System 310 illustrates the storage stack having substrate 320, source 322, select 324, deck 330 (the lower deck), interlayer 338, deck 350 (the lower middle deck), interlayer 358, deck 370 (the upper middle deck), interlayer 372, and deck 374 (the upper deck). Interlayer 338, interlayer 358, and interlayer 372 represent interdeck conductors to connect conductive pillars for the vertical channel, as well as the interdeck insulator that electrically isolates the decks.

In one example, system 310 includes control 382, which represents control circuitry to apply voltages to wordlines of the various decks. It will be understood that the voltage applied to the wordlines is relevant as a voltage difference/potential relative to the select lines and the bitlines, where the bitlines are not illustrated in system 310. Control 382 can provide selected voltages to wordlines for read operations, write operations, WEP commands, and deck reset read commands.

System 310 illustrates control 382 providing voltage 384 to deck 330, voltage 386 to deck 350, voltage 388 to deck 370, and voltage 390 to deck 374. Consider a scenario where deck 350 is selected to maintain holes in its vertical channels, and deck 330, deck 370, and deck 374 are not selected to maintain holes in their vertical channels. In such a scenario, voltage 386 can be a voltage that causes a voltage difference across the cells that is low enough to not turn on the NAND cells. In the scenario, voltage 384, voltage 388, and voltage 390 can be voltages that cause a voltage difference across the cells high enough to turn on the NAND cells. Thus, the current flow can introduce electrons into the pillars for these decks. It will be understood that there can be any combination of scenarios with various decks selected and others unselected.

In one example, control 382 provides the voltages based on conditions evaluated by the storage controller (not illustrated in system 310). Conditions 392 represent the conditions that can be evaluated to determine the voltage levels provided by control 382. It will be understood that while there is an arrow from conditions 392 to control 382, the arrow represents the operation of control 382 is affected by conditions 392, not necessarily that control 382 directly receives or evaluates the conditions. Conditions 392 can include any condition indicated above.

It will be understood that system 310 directs control 382 to provide the voltages for a deck reset read in response to a system command. The system command can be issued when the pillars are populated with holes, which can be based on any condition indicated above. The ability to selectively choose how the different decks are biased, system 310 can provide different biasing treatment to different decks.

Control 382 can be or include bias circuitry. Control 382 can selectively bias the decks of the storage device, applying low bias to one or more decks and applying high bias to one or more other decks to effect an MARR operation. Control 382 can select decks for excess pillar holes 394, and can bias the decks accordingly. Control 382 can deselect other decks from having excess pillar holes 394. The selection and deselection of decks can be based on any number of conditions.

In one example, control 382 applies bias to the decks based on timing conditions. Thus, conditions 392 can include timing factors 392T, such as after application of a WEP 392A, after bringing the storage device up from a suspend state 392B, after bringing the storage device up from an idle state 392C, or some other timing. In one example, conditions 392 include factors 392S related to structure and operations, such as a storage policy for the storage device 392D, where types of data are stored on specific decks 392E, temperature of the storage device 392F, architecture of the 3D NAND cells 392G, or other factors.

FIG. 4 is a plot of an example of voltage levels for a 3D NAND system. Diagram 400 illustrates different voltage levels over time. It will be understood that the voltage curves illustrated are examples of shape and relative level, without necessarily being to scale.

Diagram 400 illustrates curve 412, which represents a low bias for a wordline. As labeled, curve 412 can represent a voltage level for WLs of a selected (SEL) deck. Curve 414 represents a voltage level for the select gate lines. Curve 416 represents a source (SRC) and bitline voltage level for a discharge erase. Curve 418 can represent a voltage level for WLs of a selected (SEL) deck. Curve 420 represents a source and bitline voltage for a standard erase.

The discharge erase pulse of curve 416 can be an erase pulse applied for a WEP, with the wordlines selected for erase set to the voltage of curve 412. Thus, the voltage differential for the WEP is the difference between curve 416 and curve 412, as opposed to a standard erase pulse that has the difference between curve 420 and curve 412.

In one example, in a high workload usage, NAND pillars are constantly boosted for operation. The voltage between the local WL and the channel inhibits the detrapping of shallowly trapped electrons, which can accumulate over cycles and cause a significant Vt downshift. WEP operation can discharge the boosted pillars and release the shallowly trapped electrons.

WEP induces stable state, by allowing the holes to flow. A read operation right after WEP on the same superblock can induce hot carrier disturb (either electron or hole), referred to as SRD (stable state read disturb). Hot electron disturb can occur on the wordlines adjacent the unselected wordline. Hot hole disturb can occur on the unselected wordlines.

FIGS. 5A-5C are tables of an example of selecting different decks for a deck reset read. The tables provide a representation for a storage device having three decks, a lower deck (LD), middle deck (MD), and upper deck (UD). It will be understood that a storage device with a different number of decks can similarly apply the principles described in these examples.

In the examples, one of the three decks is selected for MARR. In one example, the selected deck is grounded, and the other decks set to a read (RD) reset voltage. More explicitly, the wordlines of the selected deck are biased to ground, and the other decks are biased to the read reset voltage.

FIG. 5A is an example of a table for selecting the lower deck for MARR. Table 510 illustrates voltages for the different portions of the storage stack. In one example, to select the lower deck for MARR, LD is biased to ground (GND), and MD and UD are biased to RD reset. In one example, SGD is set to a source (SRC) reset. In one example, SGD follows UD, and SRC reset is the same level as RD reset. In one example, SGS is set to ground, following LD. SRC can be set to ground, as is the BL.

In one example, a deck in a superblock is in a "clean list", being identified for a specific use. In such a case, the system can issue WEP to induce the stable state in the entire superblock, immediately followed by a MARR that puts the two valid decks back to the transient state, and leaving the clean list deck in the stable state.

FIG. 5B is an example of a table for selecting the middle deck for MARR. Table 520 illustrates voltages for the different portions of the storage stack. In one example, to select the middle deck for MARR, MD is biased to GND, and LD and UD are biased to RD reset. In one example, SGD and SGS are set to SRC reset. In one example, SGD follows UD, and SGS follows LD, and SRC reset is the same level as RD reset. SRC can be set to ground, as is the BL.

FIG. 5C is an example of a table for selecting the upper deck for MARR. Table 530 illustrates voltages for the different portions of the storage stack. In one example, to select the upper deck for MARR, UD is biased to GND, and LD and MD are biased to RD reset. In one example, SGD is set to GND and SGS is set to SRC reset. In one example, SGD follows UD and is also set to GND. In one example, SGS follows LD, and SRC reset is the same level as RD reset. SRC can be set to ground, as is the BL.

Figure 6:
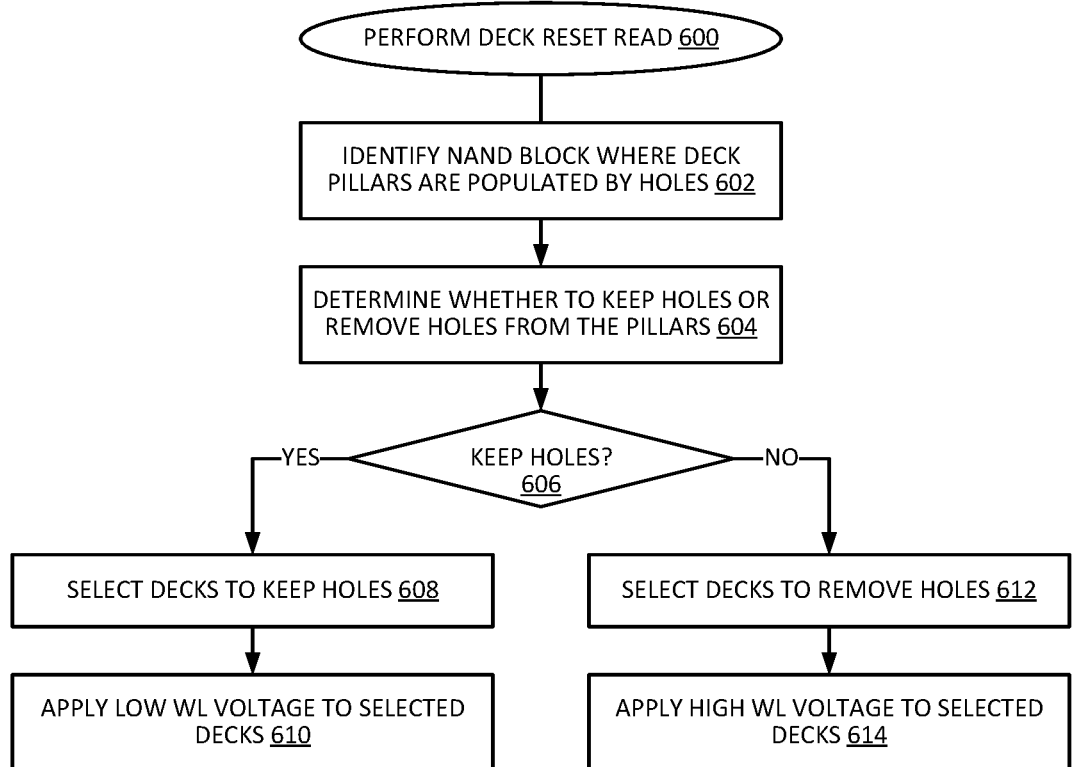
FIG. 6 is a flow diagram of biasing a multideck storage array to balance data retention with the risk of stable state read disturb.

FIG. 6 is a flow diagram of biasing a multideck storage array to balance data retention with the risk of stable state read disturb. Process 600 represents a process for performing deck reset read in accordance with an example of system described above.

In one example, the system identifies a NAND block where deck pillars are populated by holes, at 602. The identification of the NAND block populated by holes can be based on timing, such as after an idle or after a WEP. The system can determine whether to keep holes or remove holes from the pillars for the deck, at 604. In one example, the selection of the deck or decks to keep holes and which to remove holes is based on architectural factors or system policy.

For a deck where the system will keep the holes in the deck, at 606 YES branch, the system can select the decks to keep holes, at 608. In one example, the system applies a low wordline voltage to the selected deck/decks, at 610.

For a deck where the system will not keep the holes in the deck, at 606 NO branch, the system can select the decks to remove the holes, at 612. In one example, the system applies a high wordline voltage to selected decks, at 614.

Figure 7A:
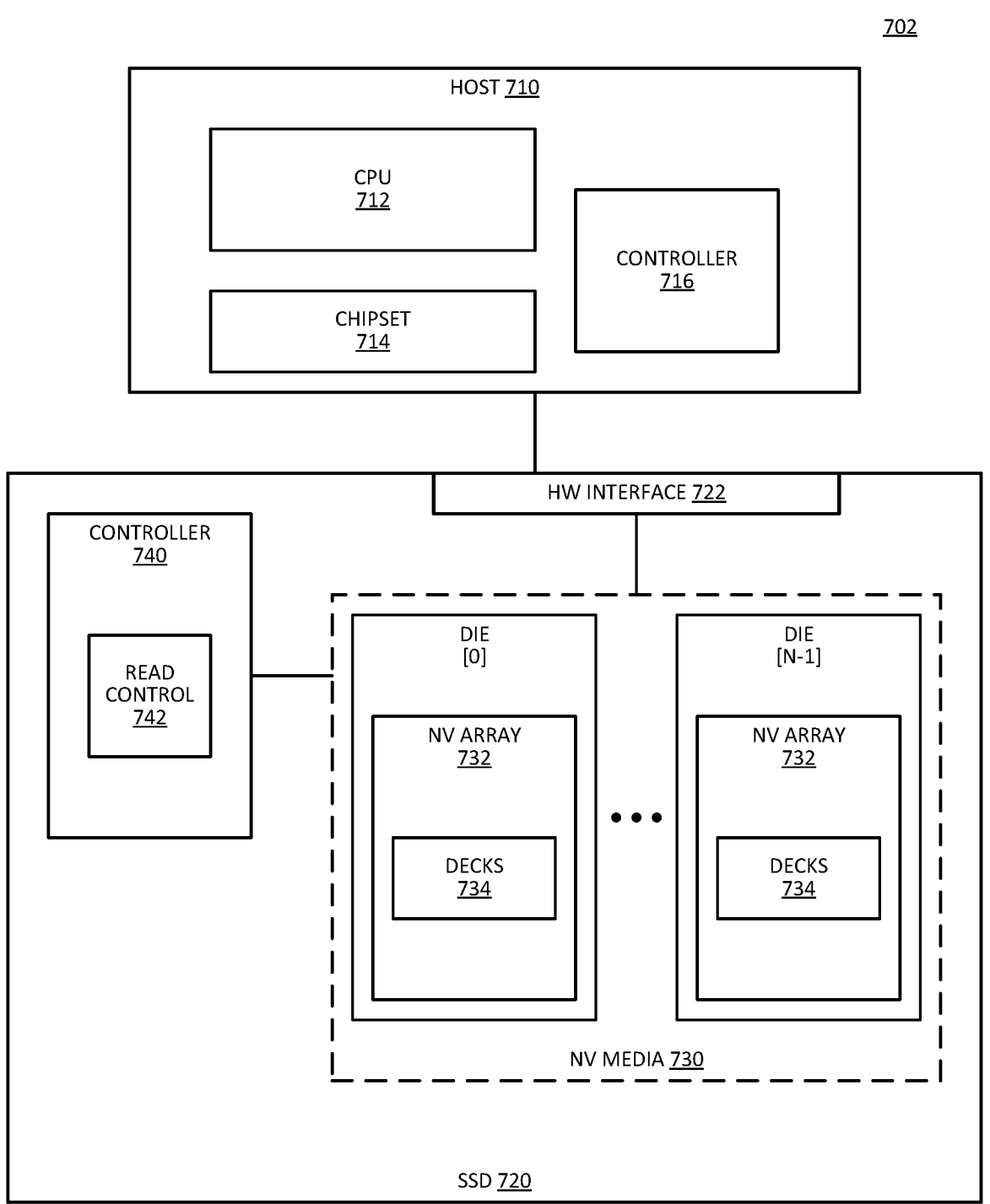
FIG. 7A is a block diagram of an example of a system with a solid state drive (SSD) in which a deck reset read can be implemented.

FIG. 7A is a block diagram of an example of a system with an SSD (solid state drive) in which a deck reset read can be implemented. System 702 represents components of a storage system in accordance with an example of system 100 or system 310. System 702 can be a 3D NAND storage device that supports deck reset reads.

System 702 includes host 710 coupled to SSD 720. Host 710 represents a host hardware platform that connects to SSD 720. Host 710 includes CPU (central processing unit) 712 or other processor as a host processor or host processor device. CPU 712 represents any host processor that generates requests to access data stored on SSD 720, either to read the data or to write data to the storage. Such a processor can include a single or multicore processor, a primary processor for a computing device, a graphics processor, a peripheral processor, or a supplemental or auxiliary processor, or a combination. CPU 712 can execute a host OS and other applications to cause the operation of system 702.

Host 710 includes chipset 714, which represents hardware components such as interconnect circuits and logic to enable access to SSD 720. Host 710 includes controller 716, which represents a storage controller or memory controller on the host side to control access to SSD 720. In one example, controller 716 is included in chipset 714. In one example, controller 716 is included in CPU 712. Controller 716 can be referred to as an NV memory controller or storage controller to enable host 710 to schedule and organize commands to SSD 720 to read and write data.

SSD 720 represents a solid-state drive or other storage system or module that includes NV (nonvolatile) media 730 to store data. NV media 730 can be, for example, a 3D NAND array. SSD 720 includes HW (hardware) interface 722, which represents hardware components to interface with host 710. For example, HW interface 722 can interface with one or more buses to implement a high speed interface standard such as NVMe (nonvolatile memory express) or PCIe (peripheral component interconnect express).

In one example, NV media 730 is implemented as multiple dies, illustrated as N dies, Die[0:(N−1)]. N can be any number of devices, and is often a binary number. SSD 720 includes controller 740 to control access to NV media 730. Controller 740 represents hardware and control logic within SSD 720 to execute control over the media. Controller 740 is internal to the nonvolatile storage device or module, and is separate from controller 716 of host 710.

The NV dies of NV media 730 include 3D NV array 732, which is a three-dimensional array of storage cells based on the NV media. In one example, NV array 732 includes decks 734. In one example, controller 740 includes read control 742 to selectively implement deck reset reads and optionally can perform WEP operations, in accordance with any example herein.

Figure 7B:
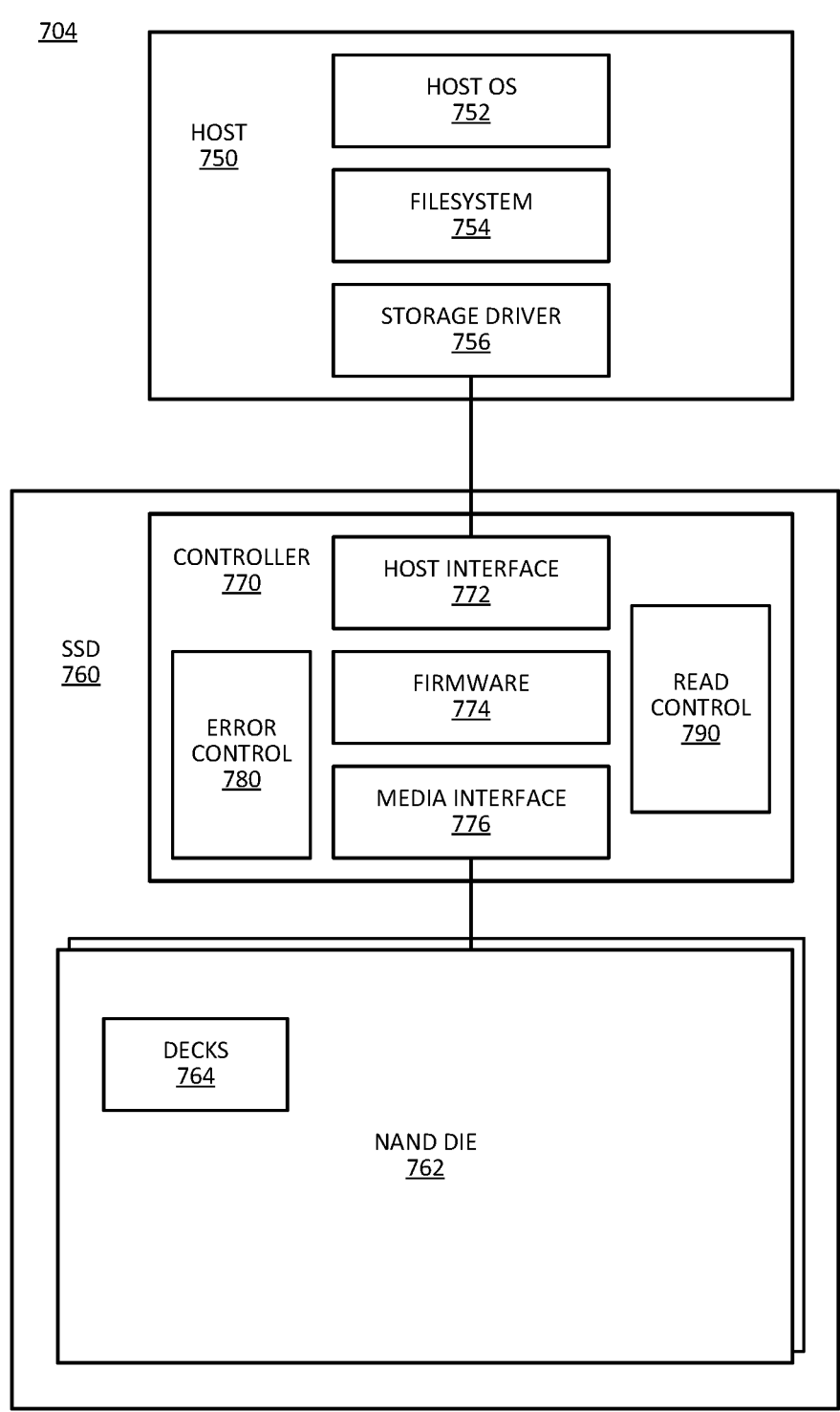
FIG. 7B is a block diagram of an example of a system with a solid state drive (SSD) with a controller to manage a deck reset read can be implemented.

FIG. 7B is a block diagram of an example of a system with a solid state drive (SSD) with a controller to manage a deck reset read can be implemented. System 704 provides one example of a system in accordance with system 702 of FIG. 7A. System 704 can represent software and firmware components of an example of system 702, as well as physical components. In one example, host 750 provides one example of host 710. In one example, SSD 760 provides one example of SSD 720.

In one example, host 750 includes host OS 752, which represents a host operating system or software platform for the host. Host OS 752 can include a platform on which applications, services, agents, and/or other software executes, and is executed by a processor. Filesystem 754 represents control logic for controlling access to the NV media. Filesystem 754 can manage what addresses or memory locations are used to store what data. There are numerous filesystems known, and filesystem 754 can implement known filesystems or other proprietary systems. In one example, filesystem 754 is part of host OS 752.

Storage driver 756 represents one or more system-level modules that control the hardware of host 750. In one example, drivers 756 include a software application to control the interface to SSD 760, and thus control the hardware of SSD 760. Storage driver 756 can provide a communication interface between the host and the SSD.

Controller 770 of SSD 760 includes firmware 774, which represents control software/firmware for the controller. In one example, controller 770 includes host interface 772, which represents an interface to host 750. In one example, controller 770 includes media interface 776, which represents an interface to NAND die 762. NAND die 762 represents a specific example of NV media, and includes an associated 3D NAND array.

Media interface 776 represents control that is executed on hardware of controller 770. It will be understood that controller 770 includes hardware to interface with host 750, which can be considered to be controlled by host interface software/firmware 774. Likewise, it will be understood that controller 770 includes hardware to interface with NAND die 762. In one example, code for host interface 772 can be part of firmware 774. In one example, code for media interface 776 can be part of firmware 774.

In one example, controller 770 includes error control 780 to handle data errors in accessed data, and corner cases in terms of compliance with signaling and communication interfacing. Error control 780 can include implementations in hardware or firmware, or a combination of hardware and software.

In one example, NAND die 762 has decks 764. In one example, controller 770 includes read control 790 to manage the deck reset read in accordance with any example herein.

Figure 8:
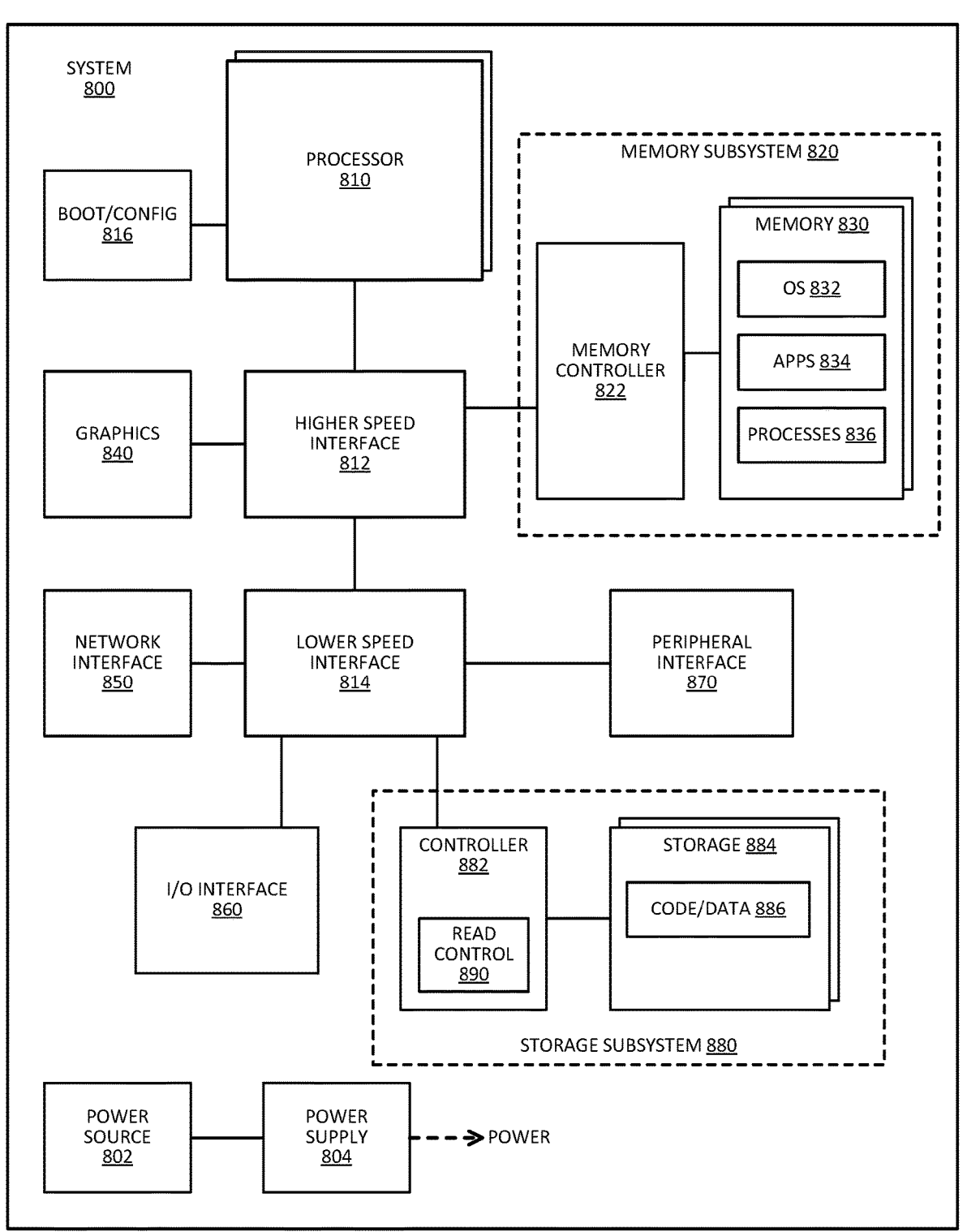
FIG. 8 is a block diagram of an example of a computing system in which a deck reset read can be implemented.

FIG. 8 is a block diagram of an example of a computing system in which a deck reset read can be implemented. System 800 represents a computing device in accordance with any example herein, and can be a laptop computer, a desktop computer, a tablet computer, a server, a gaming or entertainment control system, embedded computing device, or other electronic device.

System 800 represents a system with storage in accordance with an example of system 100 or system 310. In one example, storage 884 has multiple decks that support deck reset read. In one example, controller 882 includes read control 890 to manage the deck reset read in accordance with any example herein.

System 800 includes processor 810 can include any type of microprocessor, central processing unit (CPU), graphics processing unit (GPU), processing core, or other processing hardware, or a combination, to provide processing or execution of instructions for system 800. Processor 810 can be a host processor device. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

System 800 includes boot/config 816, which represents storage to store boot code (e.g., basic input/output system (BIOS)), configuration settings, security hardware (e.g., trusted platform module (TPM)), or other system level hardware that operates outside of a host OS. Boot/config 816 can include a nonvolatile storage device, such as read-only memory (ROM), flash memory, or other memory devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display or ultra high definition (UHD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more varieties of random-access memory (RAM) such as DRAM, 3DXP (three-dimensional crosspoint), or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include stand-alone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary network interface circuit. Network interface 850 can provide a network connection to exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, NAND, 3DXP, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 800 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
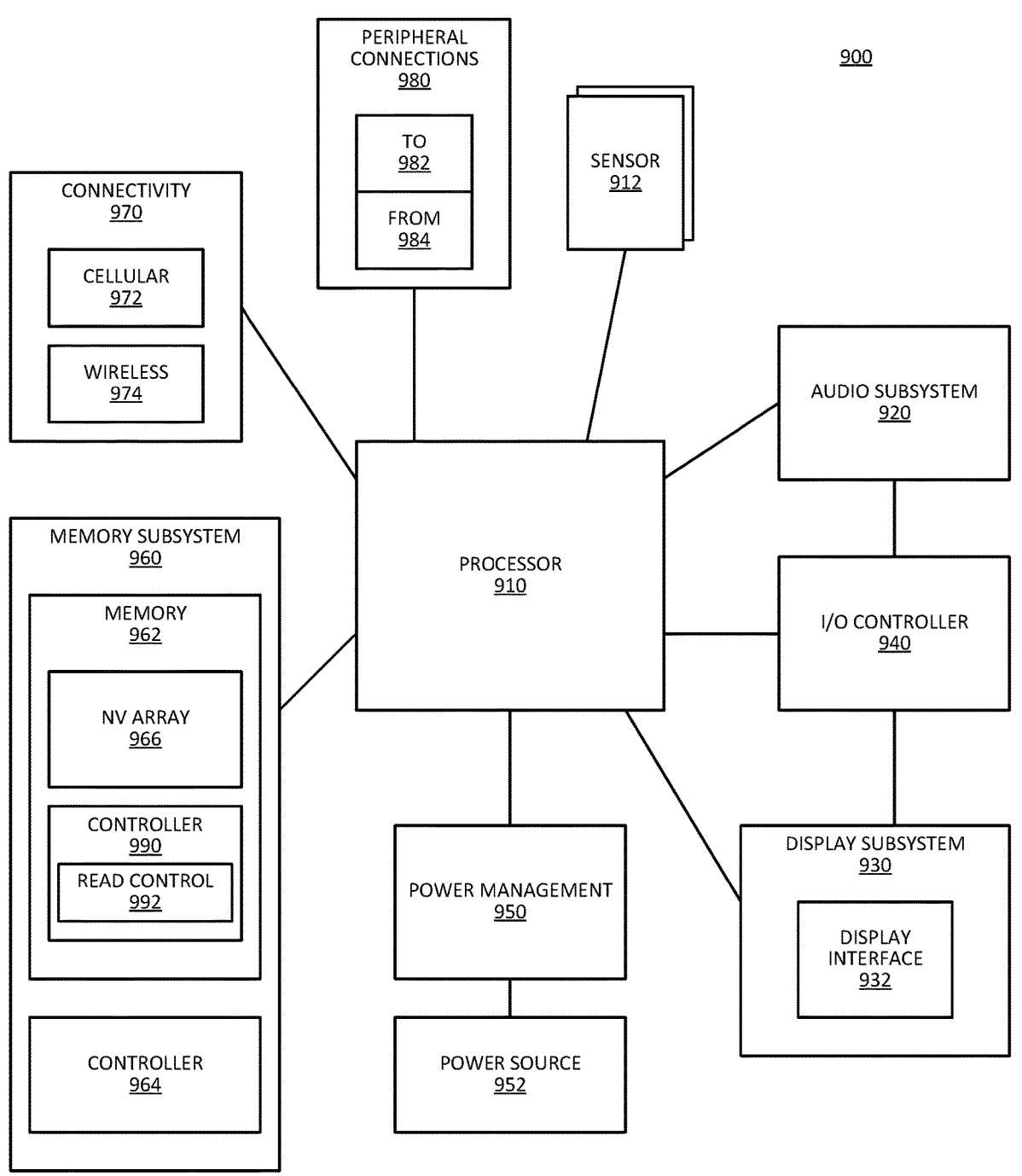
FIG. 9 is a block diagram of an example of a mobile device in which a deck reset read can be implemented.

FIG. 9 is a block diagram of an example of a mobile device in which a deck reset read can be implemented. System 900 represents a mobile computing device, such as a computing tablet, a mobile phone or smartphone, wearable computing device, or other mobile device, or an embedded computing device. It will be understood that certain of the components are shown generally, and not all components of such a device are shown in system 900.

System 900 represents a system with storage in accordance with an example of system 100 or system 310. In one example, memory 962 includes NV array 966 with multiple decks that support deck reset read. In one example, controller 990 includes read control 992 to manage the deck reset read in accordance with any example herein.

System 900 includes processor 910, which performs the primary processing operations of system 900. Processor 910 can be a host processor device. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting system 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, system 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 900, or connected to system 900. In one example, a user interacts with system 900 by providing audio commands that are received and processed by processor 910.

Display subsystem 930 represents hardware (e.g., display devices) and software components (e.g., drivers) that provide a visual display for presentation to a user. In one example, the display includes tactile components or touch-screen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to system 900 through which a user might interact with the system. For example, devices that can be attached to system 900 might include microphone devices, speaker or stereo systems, video systems or other display device, keyboard or keypad devices, buttons/switches, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of system 900. Additionally, audio output can be provided instead of or in addition to display output. In another example, if display subsystem includes a touch-screen, the display device also acts as an input device, which can be at least partially managed by I/O controller 940. There can also be additional buttons or switches on system 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in system 900, or sensors 912. The input can be part of direct user interaction, as well as providing environmental input to the system to influence its operations (such as filtering for noise, adjusting displays for brightness detection, applying a flash for a camera, or other features).

In one example, system 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in system 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable system 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, system 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that system 900 could both be a peripheral device ("to" 982) to other computing devices, as well as have peripheral devices ("from" 984) connected to it. System 900 commonly has a "docking" connector to connect to other computing devices for purposes such as managing (e.g., downloading, uploading, changing, synchronizing) content on system 900. Additionally, a docking connector can allow system 900 to connect to certain peripherals that allow system 900 to control content output, for example, to audiovisual or other systems.

In addition to a proprietary docking connector or other proprietary connection hardware, system 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 10:
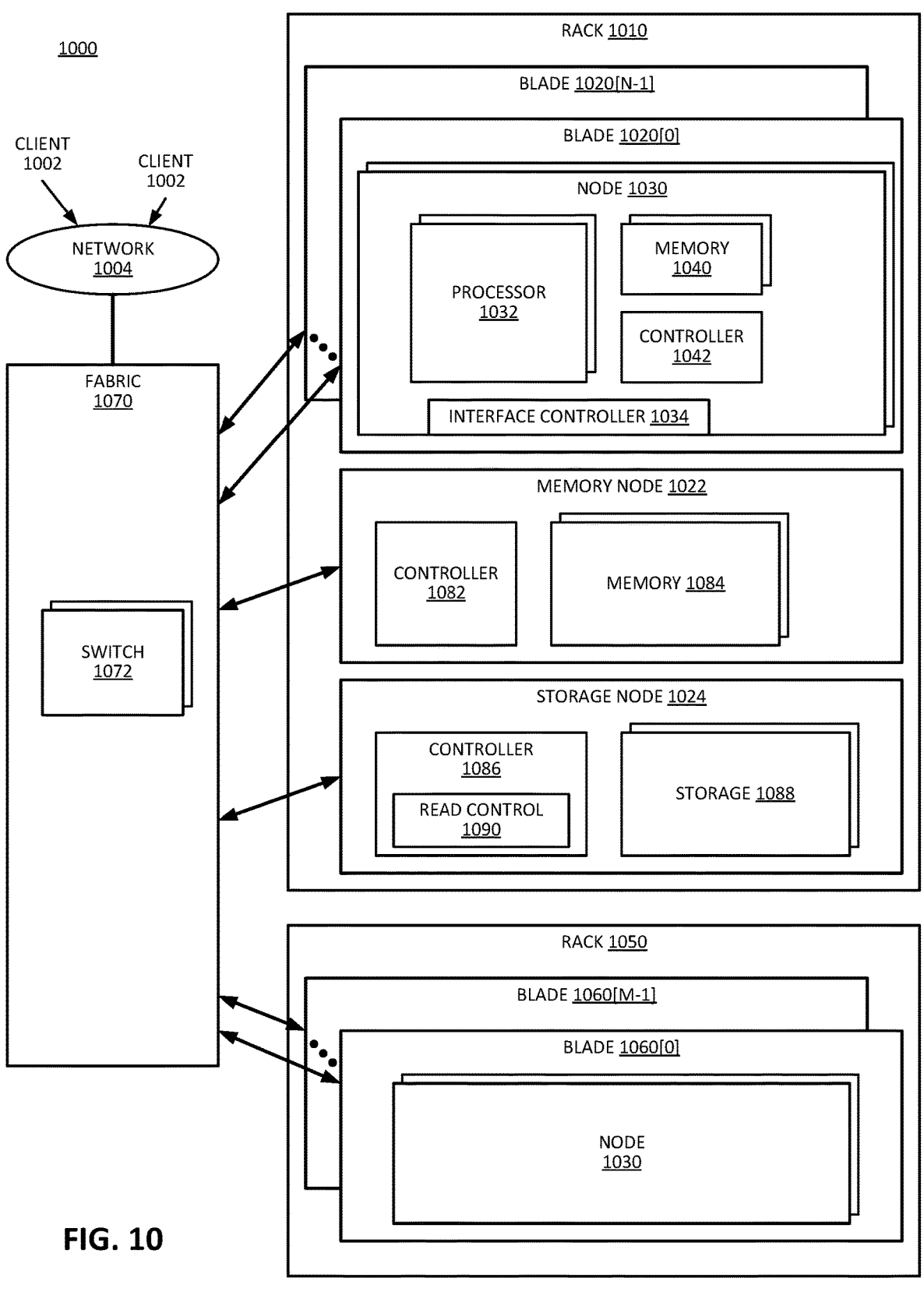
FIG. 10 is a block diagram of an example of a multi-node network in which a deck reset read can be implemented.

FIG. 10 is a block diagram of an example of a multi-node network in which a deck reset read can be implemented. System 1000 represents a network of nodes that can apply adaptive ECC. In one example, system 1000 represents a data center. In one example, system 1000 represents a server farm. In one example, system 1000 represents a data cloud or a processing cloud.

System 1000 represents a system with storage in accordance with an example of system 100 or system 310. In one example, storage 1088 has multiple decks that support deck reset read. In one example, controller 1086 includes read control 1090 to manage the deck reset read in accordance with any example herein.

One or more clients 1002 make requests over network 1004 to system 1000. Network 1004 represents one or more local networks, or wide area networks, or a combination. Clients 1002 can be human or machine clients, which generate requests for the execution of operations by system 1000. System 1000 executes applications or data computation tasks requested by clients 1002.

In one example, system 1000 includes one or more racks, which represent structural and interconnect resources to house and interconnect multiple computation nodes. In one example, rack 1010 includes multiple nodes 1030. In one example, rack 1010 hosts multiple blade components, blade 1020[0], . . . , blade 1020[N−1], collectively blades 1020. Hosting refers to providing power, structural or mechanical support, and interconnection. Blades 1020 can refer to computing resources on printed circuit boards (PCBs), where a PCB houses the hardware components for one or more nodes 1030. In one example, blades 1020 do not include a chassis or housing or other "box" other than that provided by rack 1010. In one example, blades 1020 include housing with exposed connector to connect into rack 1010. In one example, system 1000 does not include rack 1010, and each blade 1020 includes a chassis or housing that can stack or otherwise reside in close proximity to other blades and allow interconnection of nodes 1030.

System 1000 includes fabric 1070, which represents one or more interconnectors for nodes 1030. In one example, fabric 1070 includes multiple switches 1072 or routers or other hardware to route signals among nodes 1030. Additionally, fabric 1070 can couple system 1000 to network 1004 for access by clients 1002. In addition to routing equipment, fabric 1070 can be considered to include the cables or ports or other hardware equipment to couple nodes 1030 together. In one example, fabric 1070 has one or more associated protocols to manage the routing of signals through system 1000. In one example, the protocol or protocols is at least partly dependent on the hardware equipment used in system 1000.

As illustrated, rack 1010 includes N blades 1020. In one example, in addition to rack 1010, system 1000 includes rack 1050. As illustrated, rack 1050 includes M blade components, blade 1060[0], . . . , blade 1060[M−1], collectively blades 1060. M is not necessarily the same as N; thus, it will be understood that various different hardware equipment components could be used, and coupled together into system 1000 over fabric 1070. Blades 1060 can be the same or similar to blades 1020. Nodes 1030 can be any type of node and are not necessarily all the same type of node. System 1000 is not limited to being homogenous, nor is it limited to not being homogenous.

The nodes in system 1000 can include compute nodes, memory nodes, storage nodes, accelerator nodes, or other nodes. Rack 1010 is represented with memory node 1022 and storage node 1024, which represent shared system memory resources, and shared persistent storage, respectively. One or more nodes of rack 1050 can be a memory node or a storage node.

Nodes 1030 represent examples of compute nodes. For simplicity, only the compute node in blade 1020[0] is illustrated in detail. However, other nodes in system 1000 can be the same or similar. At least some nodes 1030 are computation nodes, with processor (proc) 1032 and memory 1040. A computation node refers to a node with processing resources (e.g., one or more processors) that executes an operating system and can receive and process one or more tasks. In one example, at least some nodes 1030 are server nodes with a server as processing resources represented by processor 1032 and memory 1040.

Memory node 1022 represents an example of a memory node, with system memory external to the compute nodes. Memory nodes can include controller 1082, which represents a processor on the node to manage access to the memory. The memory nodes include memory 1084 as memory resources to be shared among multiple compute nodes.

Storage node 1024 represents an example of a storage server, which refers to a node with more storage resources than a computation node, and rather than having processors for the execution of tasks, a storage server includes processing resources to manage access to the storage nodes within the storage server. Storage nodes can include controller 1086 to manage access to the storage 1088 of the storage node.

In one example, node 1030 includes interface controller 1034, which represents logic to control access by node 1030 to fabric 1070. The logic can include hardware resources to interconnect to the physical interconnection hardware. The logic can include software or firmware logic to manage the interconnection. In one example, interface controller 1034 is or includes a host fabric interface, which can be a fabric interface in accordance with any example described herein. The interface controllers for memory node 1022 and storage node 1024 are not explicitly shown.

Processor 1032 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1040 can be or include memory devices represented by memory 1040 and a memory controller represented by controller 1042.

In general with respect to the descriptions herein, in one aspect, a storage device includes: multiple decks of three dimensional (3D) NAND cells, the multiple decks including a first deck and a second deck, each of the multiple decks having multiple wordlines stacked vertically; and bias circuitry to apply a low bias to the first deck, with a first voltage low enough to not turn on the NAND cells of the first deck, and simultaneously apply a high bias to the second deck, with a second voltage high enough to turn on the NAND cells of the second deck.

In accordance with one example of the storage device, the bias circuitry is to apply the low bias to the first deck and the high bias to the second deck based on timing. In accordance with any preceding example of the storage device, in one example, the timing comprises after application of a weak erase pulse (WEP). In accordance with any preceding example of the storage device, in one example, the timing comprises after bringing the storage device up from a suspend state. In accordance with any preceding example of the storage device, in one example, the timing comprises after bringing the storage device up from an idle state. In accordance with any preceding example of the storage device, in one example, the bias circuitry is to apply the low bias to the first deck to select the first deck for excess pillar holes, and is to apply the high bias to the second deck to deselect the second deck from having excess pillar holes. In accordance with any preceding example of the storage device, in one example, selection and deselection are based on a storage policy for the storage device. In accordance with any preceding example of the storage device, in one example, selection and deselection are based on a temperature of the storage device. In accordance with any preceding example of the storage device, in one example, selection and deselection are based on an architecture of the 3D NAND cells.

In general with respect to the descriptions herein, in one aspect, a system includes: a processor device; and a storage device coupled to the processor device, the storage device including multiple decks of three dimensional (3D) NAND cells, the multiple decks including a first deck and a second deck, each of the multiple decks having multiple wordlines stacked vertically; and bias circuitry to apply a low bias to the first deck, with a first voltage low enough to not turn on the NAND cells of the first deck, and simultaneously apply a high bias to the second deck, with a second voltage high enough to turn on the NAND cells of the second deck.

In accordance with one example of the system, the bias circuitry is to apply the low bias to the first deck and the high bias to the second deck based on timing. In accordance with any preceding example of the system, in one example, the timing comprises after application of a weak erase pulse (WEP). In accordance with any preceding example of the system, in one example, the timing comprises after bringing the storage device up from a suspend state. In accordance with any preceding example of the system, in one example, the timing comprises after bringing the storage device up from an idle state. In accordance with any preceding example of the system, in one example, the bias circuitry is to apply the low bias to the first deck to select the first deck for excess pillar holes, and is to apply the high bias to the second deck to deselect the second deck from having excess pillar holes. In accordance with any preceding example of the system, in one example, selection and deselection are based on a storage policy for the storage device. In accordance with any preceding example of the system, in one example, selection and deselection are based on a temperature of the storage device. In accordance with any preceding example of the system, in one example, selection and deselection are based on an architecture of the 3D NAND cells. In accordance with any preceding example of the system, in one example, the processor device comprises a multicore processor. In accordance with any preceding example of the system, in one example, the system includes a display communicatively coupled to the processor device. In accordance with any preceding example of the system, in one example, the system includes a battery to power the system. In accordance with any preceding example of the system, in one example, the system includes a network interface circuit to couple with a remote device over a network connection.

In general with respect to the descriptions herein, in one aspect, a method includes: in a storage device having multiple decks of three dimensional (3D) NAND cells, the multiple decks including a first deck and a second deck, each of the multiple decks having multiple wordlines stacked vertically, applying a low bias to the first deck, with a first voltage low enough to not turn on the NAND cells of the first deck; and simultaneously applying a high bias to the second deck, with a second voltage high enough to turn on the NAND cells of the second deck.

In accordance with one example of the method, applying the low bias comprises applying the low bias to the first deck and the high bias to the second deck based on timing. In accordance with any preceding example of the method, in one example, the timing comprises after application of a weak erase pulse (WEP). In accordance with any preceding example of the method, in one example, the timing comprises after bringing the storage device up from a suspend state. In accordance with any preceding example of the method, in one example, the timing comprises after bringing the storage device up from an idle state. In accordance with any preceding example of the method, in one example, applying the low bias to the first deck to select the first deck for excess pillar holes, and applying the high bias to the second deck to deselect the second deck from having excess pillar holes. In accordance with any preceding example of the method, in one example, selection and deselection are based on a storage policy for the storage device. In accordance with any preceding example of the method, in one example, selection and deselection are based on a temperature of the storage device. In accordance with any preceding example of the method, in one example, selection and deselection are based on an architecture of the 3D NAND cells.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A storage device, comprising:

a plurality of decks of three dimensional (3D) NAND cells, the plurality of decks including a first deck and a second deck, each of the plurality of decks having a plurality of wordlines stacked vertically and a pillar;

bias circuitry coupled to the plurality of decks of 3D NAND cells, wherein the bias circuitry is configured to provide a low bias to the first deck, with a first voltage low enough to not turn on the NAND cells of the first deck, and simultaneously provide a high bias to the second deck, with a second voltage high enough to turn on the NAND cells of the second deck; and a read controller coupled to the plurality of decks, wherein the read controller is configured to access the plurality of decks via respective logic and apply a deck reset read pulse following one or more operations that cause carrier accumulation in pillars of the plurality of decks, applying the deck reset read pulse further including simultaneously applying the low bias on the wordlines of the first deck to keep holes in the pillar of the first deck and applying the high bias on the wordlines of the second deck to introduce electrons to the pillar of the second deck.

2. The storage device of claim 1, wherein the bias circuitry is to apply the low bias to the first deck and the high bias to the second deck based on timing.

3. The storage device of claim 1, wherein the read controller is configured to apply the deck reset read pulse after applying a weak erase pulse (WEP) controlling the storage device to inject holes into the plurality of decks.

4. The storage device of claim 1, wherein the read controller is configured to apply the deck reset read pulse after bringing the storage device up from a suspend state.

5. The storage device of claim 1, wherein the read controller is configured to apply the deck reset read pulse after bringing the storage device up from an idle state.

6. The storage device of claim 1, wherein the bias circuitry is to apply the low bias to the first deck to select the first deck for the holes including first excess pillar holes, and is to apply the high bias to the second deck to deselect the second deck from having second excess pillar holes.

7. The storage device of claim 6, wherein selection and deselection are based on a storage policy for the storage device.

8. The storage device of claim 6, wherein selection and deselection are based on a temperature of the storage device.

9. The storage device of claim 6, wherein selection and deselection are based on an architecture of the 3D NAND cells.

10. A system comprising:

a processor device; and a storage device coupled to the processor device, the storage device including:

a plurality of decks of three dimensional (3D) NAND cells, the plurality of decks including a first deck and a second deck, each of the plurality of decks having a plurality of wordlines stacked vertically and a pillar;

bias circuitry coupled to the plurality of decks of 3D NAND cells, wherein the bias circuitry is configured to provide a low bias to the first deck, with a first voltage low enough to not turn on the NAND cells of the first deck, and simultaneously provide a high bias to the second deck, with a second voltage high enough to turn on the NAND cells of the second deck; and a read controller coupled to the plurality of decks, wherein the read controller is configured to access the plurality of decks via respective logic and apply a deck reset read pulse following one or more operations that cause carrier accumulation in pillars of the plurality of decks, applying the deck reset read pulse further including simultaneously applying the low bias on the wordlines of the first deck to keep holes in the pillar of the first deck and applying the high bias on the wordlines of the second deck to introduce electrons to the pillar of the second deck.

11. The system of claim 10, wherein the bias circuitry is to apply the low bias to the first deck and the high bias to the second deck based on timing.

12. The system of claim 10, wherein the read controller is configured to apply the deck reset read pulse after applying a weak erase pulse (WEP) controlling the storage device to inject holes into the plurality of decks.

13. The system of claim 10, wherein the read controller is configured to apply the deck reset read pulse after bringing the storage device up from one of a suspend state and an idle state.

14. The system of claim 10, wherein the bias circuitry is to apply the low bias to the first deck to select the first deck for the holes including first excess pillar holes, and is to apply the high bias to the second deck to deselect the second deck from having second excess pillar holes.

15. The system of claim 14, wherein selecting the first deck and deselecting the second deck are based on at least one of a storage policy for the storage device, a temperature of the storage device, or an architecture of the 3D NAND cells.

16. The system of claim 10, wherein the processor device comprises a multicore processor, and the system further comprises one or more of:

a display communicatively coupled to the processor device;

a battery configured to power the system; and a network interface circuit to be coupled to a remote device over a network connection.

17. A method implemented at a storage device, comprising:

simultaneously providing a low bias for a first deck of the storage device and providing a high bias to a second deck of the storage device, wherein:

the storage device includes a plurality of decks further including the first deck and the second deck;

each of the plurality of decks includes three dimensional (3D) NAND cells, a plurality of wordlines stacked vertically, and a pillar; and the low bias includes a first voltage low enough to not turn on the NAND cells of the first deck, and the high bias includes a second voltage high enough to turn on the NAND cells of the second deck;

accessing the plurality of decks to apply a deck reset read pulse following one or more operations that cause carrier accumulation in pillars of the plurality of decks; and applying the deck reset read pulse, including simultaneously applying the low bias on the wordlines of the first deck to keep holes in the pillar of the first deck and applying the high bias on the wordlines of the second deck to introduce electrons to the pillar of the second deck.

18. The method of claim 17, wherein accessing the plurality of decks further comprises:

selecting the first deck for the holes including first excess pillar holes; and deselecting the second deck from having second excess pillar holes.

19. The method of claim 18, wherein selecting the first deck and deselecting the second deck are based on at least one of a storage policy for the storage device, a temperature of the storage device, or an architecture of the 3D NAND cells.

20. The method of claim 17, wherein the deck reset read pulse is applied after a weak erase pulse (WEP) is applied to inject holes into the plurality of decks, after the storage device up is brought up from a suspend state, after the storage device is brought up from an idle state.

* * * * *